United States Patent [19]

Shimotori et al.

[11] 4,384,218

[45] May 17, 1983

[54] SUBSTRATE BIAS GENERATOR

[75] Inventors: Kazuhiro Shimotori; Toshio Ichiyama; Yooichi Tobita, all of Itami, Japan

[73] Assignee: Mitsubishi Denki Kabushiki Kaisha, Tokyo, Japan

[21] Appl. No.: 171,420

[22] Filed: Jul. 23, 1980

[30] Foreign Application Priority Data

Jul. 23, 1979 [JP] Japan .................. 54-93918

[51] Int. Cl.³ .............. H03K 3/353; H03K 3/01; H01L 29/78; H01L 27/02
[52] U.S. Cl. .............. 307/304; 307/296 R; 307/297; 357/41; 357/23
[58] Field of Search .............. 357/24 R, 41, 23 C; 307/304, 296 R, 297

[56] References Cited

U.S. PATENT DOCUMENTS

| | | | |
|---|---|---|---|
| 3,794,862 | 2/1974 | Jenne | 357/24 R |
| 4,115,794 | 9/1978 | De La Moneda | 357/24 R |
| 4,142,114 | 2/1979 | Green | 307/297 |
| 4,255,677 | 3/1981 | Boonstra et al. | 357/24 |
| 4,255,756 | 3/1981 | Shimotori et al. | 357/41 |

OTHER PUBLICATIONS

Pashley et al., "A 70-ns 1K MOS RAM", IEEE Int. Solid-State Circuits Conf. (2/76), Dig. Tech. Papers, pp. 138-139, 238.

*Primary Examiner*—Gene M. Munson
*Attorney, Agent, or Firm*—Wenderoth, Lind & Ponack

[57] ABSTRACT

A substrate bias generator which includes: an MOS capacitor having an electrically insulating film located between two electrodes, one of which is disposed on one main face of a P⁻semiconductor substrate; and first, second and a third N⁺ semiconductor regions disposed in a spaced relationship on that main face. The first and second regions form a grounded source and a drain of an MOSFET having a gate connected to both the drain and the other electrode of the capacitor. The second and third regions form a source and a drain of another MOSFET having a gate connected to both the drain and the other main face of the substrate. A train of square pulses is supplied to the one electrode of the capacitor.

1 Claim, 13 Drawing Figures

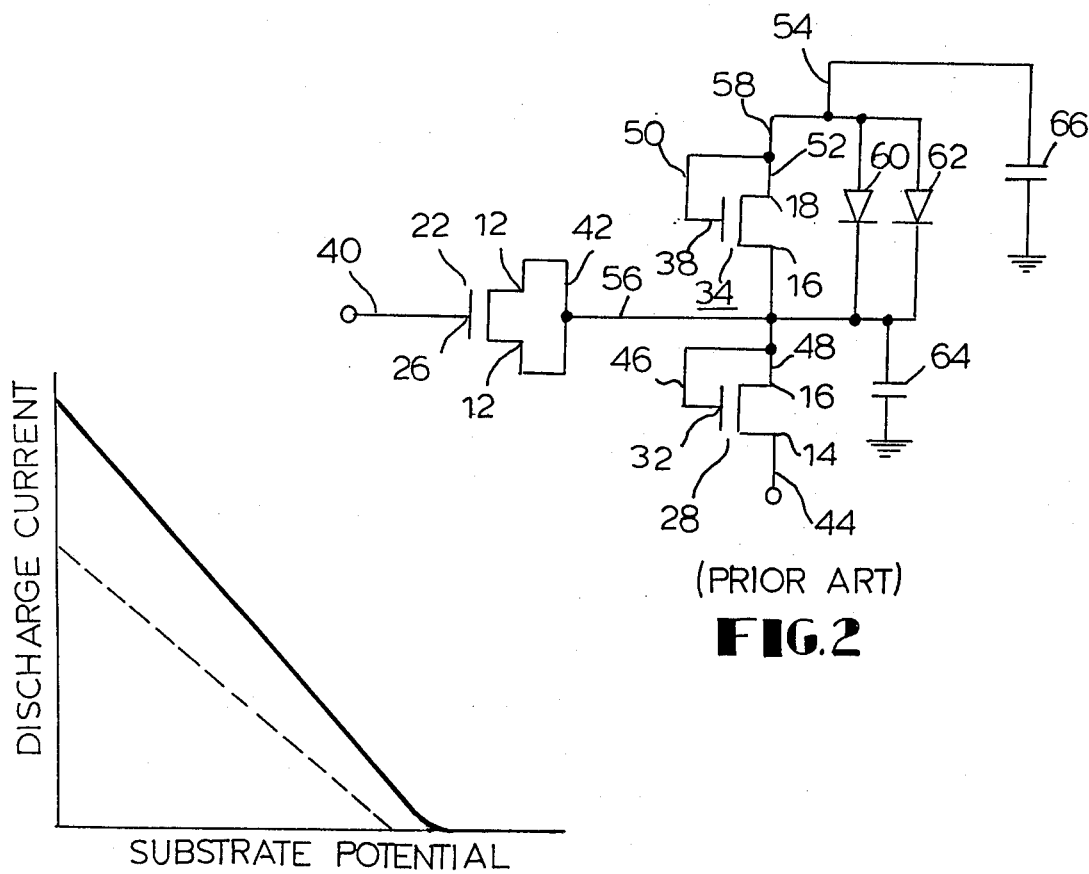
FIG. 2 (PRIOR ART)
FIG. 4 (PRIOR ART)
FIG. 3a
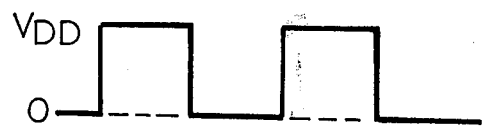
FIG. 3b
FIG. 3c
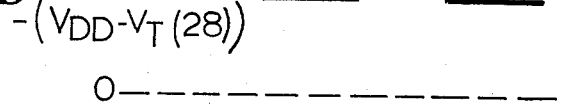
(PRIOR ART)

SUBSTRATE BIAS GENERATOR

BACKGROUND OF THE INVENTION

This invention relates to a substrate bias generator for producing a potential in a semiconductor substrate, and more particularly to such a generator used with an integrated circuit including, as the fundamental elements, insulated gate type MOS field effect transistors and especially used with a dynamic circuit.

Conventional substrate bias generators have comprised an MOS capacitor and one pair of serially connected MOSFET's (which is the abbreviation for MOS field effect transistors) with each gate electrode connected to the associated drain electrode disposed on one of the opposite main faces of the $P^-$ type semiconductor substrate and interconnected so that the MOS capacitor is connected to the junction of the MOSFET's and one of the MOSFET's has a source electrode which is normally placed at a ground potential while the other MOSFET has its drain electrode connected to an electrode on the other main face of the substrate. Therefore, parasitic diodes are formed between a pair of $N^+$ type semiconductor regions respectively forming an electrode for the MOS capacitor and a combined drain and source region of both MOSFET's and the substrate, while those regions and the substrate have parasitic capacitances to ground.

With a voltage in the form of a square pulse applied to the MOS capacitor so as to place the substrate bias generator in operation, electrons due to an electric charge on the parasitic capacitor associated with the substrate are injected into the substrate through the parasitic diodes, on the one hand, and through the other MOSFET and the other main face of the substrate, on the other hand. That portion of the electrons passed through the parasitic diodes are soon recombined with holes forming majority carriers within the substrate to disappear while that portion thereof passed through the MOSFET are instantaneously recombined with holes on a portion of the other main face of the substrate contacting the electrode thereon. Therefore, a shortage of holes is developed in the substrate resulting in the generation of a negative potential in the substrate. This substrate potential is developed on the electrode on the other main face of the substrate.

Conventional substrate bias generators such as described above have been difficult to be used with the dynamic memory cell in the form of an integrated circuit disposed on the same semiconductor chip as the generator. It is assumed that the dynamic memory cell includes a single MOSFET and a single MOS capacitor serially connected to each other and stores data expressed by a binary ONE by having the MOS capacitor charged to a high potential. Under these assumed conditions, some of the electrons passed through the parasitic diodes in a mating substrate bias generator might be captured by the MOS capacitor in the cell. As a result, the MOS capacitor changes from the high potential to a low potential which may reach a ground potential corresponding to a binary ZERO as the case may be. This has resulted in a malfunction of the dynamic memory cell so that a binary ZERO is read out although a binary ONE should have been written in the cell. Therefore, conventional substrate bias generators have disadvantages in that mating dynamic circuits may malfunction.

Accordingly, it is an object of the present invention to provide a new and improved substrate bias generator for producing a potential in a semiconductor substrate disposed in an integrated circuit on a semiconductor chip so as to permit a very small number of electrons to be injected into an associated semiconductor substrate to thereby minimize the probability of malfunctioning in a dynamic circuit integrated on the same chip as the generator.

SUMMARY OF THE INVENTION

The present invention provides a substrate bias generator for generating a potential in a semiconductor substrate, comprising: a semiconductor substrate of a first conductivity type and having a pair of first and second main faces which are opposite to each other; a first, a second and a third semiconductor region of a second conductivity type disposed at predetermined intervals on the first main face of the semiconductor substrate; a first MOSFET disposed on the first main face of the semiconductor substrate and having a source region formed of the first semiconductor region, a drain region formed of said second semiconductor region and a gate electrode; a second MOSFET disposed on the first main face of the semiconductor substrate and having a source region formed of the second semiconductor region, a drain region formed of the third semiconductor region, and a gate electrode; an MOS capacitor disposed on the first main face of the semiconductor substrate and having a first electrode formed of a semiconductor region of the second conductivity type disposed on the first main face of the semiconductor substrate and a second electrode disposed on the last-mentioned semiconductor region through an electrically insulating film; another electrode laid on the second main face of the semiconductor substrate, the first electrode of the MOS capacitor being supplied with positive pulses; a first electric lead for connecting the second electrode of the MOS capacitor to the gate electrode and drain region of the first MOSFET; a second electric lead for connecting the source region of the first MOSFET to ground; and a third electric lead for electrically connecting the gate electrode and drain region of the second MOSFET to the electrode on the second main face of the semiconductor substrate.

BRIEF DESCRIPTION OF THE DRAWINGS

The present invention will become more readily apparent from the following description taken in conjunction with the accompanying drawings in which:

FIG. 2 is a circuit diagram equivalent to the arrangement shown in FIG. 1;

FIGS. 3a, 3b and 3c are graphs illustrating waveforms developed at various points in the arrangement shown in FIG. 1;

FIG. 4 is a graph illustrating the relationship between a current discharged from the semiconductor substrate and a potential produced in the substrate of the arrangement shown in FIGS. 1 and 2;

DESCRIPTION OF THE PREFERRED EMBODIMENTS

Figures 1, 6:
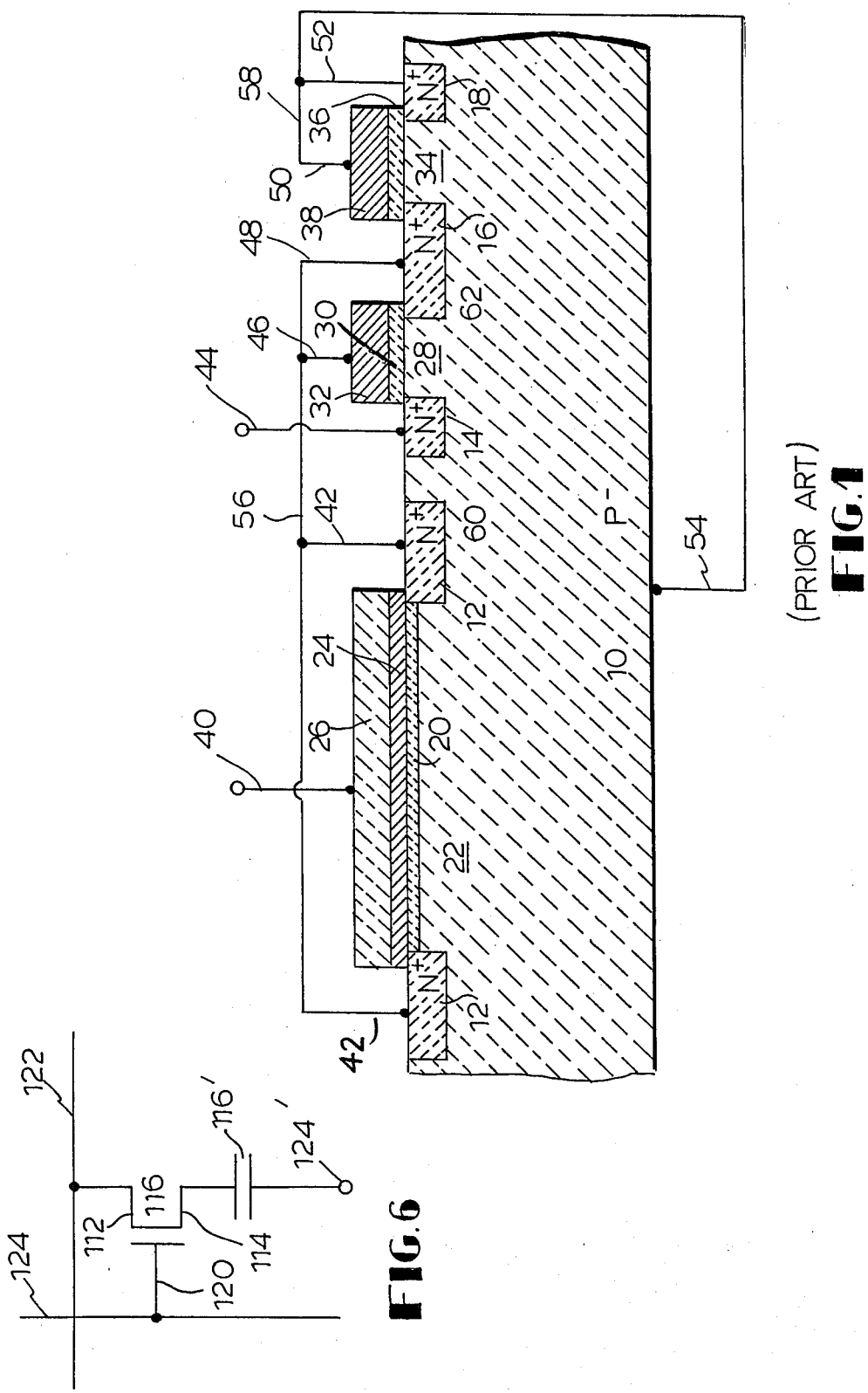
FIG. 1 is a longitudinal sectional view of a conventional substrate bias generator for producing a potential in a semiconductor substrate.
FIG. 6 is a circuit diagram equivalent to the arrangement shown in FIG. 5.

Referring now to FIG. 1 of the drawings, there is illustrated a conventional substrate bias generator for producing a potential in a semiconductor substrate. The illustrated arrangement comprises a P− type semiconductor substrate generally designated by the reference 10 and having a high resistivity and having a pair of first and second main faces which are opposite to each other, and a plurality of N+ type low resistivity semiconductor regions, in this case, five regions 12, 14, 16 and 18 disposed at a predetermined intervals on the first main face, in this case, the upper main face of the substrate 10. The two N+ type semiconductor regions 12 are interconnected through an N type semiconductor layer 20 disposed on the upper main face of the substrate to act as one electrode for an MOS type capacitor generally designated by the reference numeral 22 and having a thin electrically insulating film 24 underlaid with the N type semiconductor layer 20 and adjacent portions of the semiconductor regions 12 and a region 26 disposed on the electrically insulating film 24 so as to act as the other electrode for the MOS capacitor 22. The electrically insulating film 24 is, in many cases, formed of silicon dioxide and is called hereinafter a "gate oxide film" and the region 26 is formed of polycrystalline silicon, aluminum or molybdenum.

The N+ type semiconductor regions 14 and 16 respectively form a source and drain region of a first MOSFET generally designated by the reference numeral 28 and having a gate oxide film 30 similar to the gate oxide film 24 and disposed on the upper main face of the substrate 10 so as to bridge the regions 14 and 16, and a region 32 formed on the gate oxide film 30 of polycrystalline silicon or the like. The gate oxide film 30 and the region 32 form a part of the gate region of the MOSFET 28.

The N+ type semiconductor region 16 also forms a source region of a second MOSFET generally designated by the reference numeral 34 and having a gate oxide film 36 similar to the gate oxide film 30 and a region 38 similar to the region 32 while the N+ type semiconductor region 18 forms the drain region of the MOSFET 34. The gate oxide film 36 similarly forms a part of the gate region of the MOSFET 34 with the region 38.

An electrode 40 is connected to the region 26 forming the other electrode of the MOS capacitor 22 and electrodes 42 are connected to the N+ type semiconductor regions 12 respectively and to each other. A source, a gate and a drain electrode 44, 46 and 48 are respectively connected to the source region 14, the region 32 and the drain region 16 of the first MOSFET 28. Similarly, a gate electrode 50 and a drain electrode 52 are connected to the region 38 and the drain region 18 of the second MOSFET 34. Furthermore, an electrode 54 is attached to the second or lower main face of the semiconductor substrate 10.

The electrodes 42, the gate electrode 46 and the drain electrode 48 are connected to one another through a first electric lead 56 while the gate electrode 50, the drain electrode 52 and the electrode 54 are connected to one another through a second electric lead 58.

FIG. 2 shows a circuit equivalent to the arrangement of FIG. 1. In FIG. 2 like reference numerals designate the components identical to those shown in FIG. 1 and therefore the connection of the components will readily be understood from the foregoing description made in conjunction with FIG. 1. In FIG. 2, a parasitic diode 60 is shown as being formed between the N+ type semiconductor regions 12 and the P− type semiconductor substrate 10 due to a PN junction formed therebetween and a parasitic diode 62 is shown as being formed between the N+ type semiconductor region 16 and the P type semiconductor substrate 10 due to a PN junction formed therebetween. Furthermore, parasitic capacitances 64 and 66 to ground are equivalently respectively associated with the $N^{30}$ type semiconductor regions 12, 16 and the semiconductor substrate 10.

The operation of the arrangement shown in FIGS. 1 and 2 will now be described. For a better understanding of the subject matter of the present invention, it is useful to describe first the role of the electrode 54 connected to the semiconductor substrate 10.

In integrated circuits employing MOSFET's signals are generally transmitted therethrough by charging and discharging the source electrode and/or the drain electrode of MOSFET's, and the higher the charging and discharging rates, the more the operation of the integrated circuits is speeded up. For example, random access memory devices are required to have short access times. One of the important factors for determining the charging and discharging rates is the junction capacitance of a PN junction relative to the particular semiconductor substrate associated with either of the source and drain regions of each MOSFET involved. The smaller this junction capacitance, the less the charging and discharging rates will be. The junction capacitance $C_J$ may be generally expressed by $$C_J = K/\sqrt{V_o - V} \tag{1}$$

where $V_o$ designates a built-in potential at the PN junction and is normally about 0.6 volts, V is the voltage across either of the source and drain regions of the MOSFET and the semiconductor substrate, wherein $V<0$, and K designates a constant as determined by the type of semiconductor material used and the dimensions of the MOSFET. Since $V_o$ and K are constants as determined by the type of semiconductor material and the dimensions of the MOSFET's described above, the junction capacitance $C_J$ is permitted to decrease only with a small degree of freedom. This means that the junction capacitance $C_J$ can decrease only by negatively increasing the voltage v.

On the other hand, MOSFET's have source (or drain) voltages whose magnitude generally ranges from a ground potential to the voltage supplied by an electric source used with the particular integrated circuit, for example, +5 volts. Assuming that a substrate potential is equal to the ground potential, a potential difference V between the source (or drain) voltage and a voltage applied to the semiconductor substrate has a magnitude between the ground potential and −5 volts. On the contrary, with a voltage of, for example, −3 volts applied to the semiconductor substrate, that potential difference V has a magnitude of from $-3$ to $-8$ volts. In the latter case, the expression (1) indicates that the junction capacitance $C_J$ becomes small, resulting in the attainment of the high speed operation.

For this reason, an external electric source has been previously used to apply a potential to an associated semiconductor substrate through an electrode such as the electrode 54 shown in FIG. 1. The arrangement of FIG. 2, however, has produced a negative voltage on an associated integrated circuit formed of MOSFET's to supply it to the electrode 54 in order to eliminate a waste in that an additional external electric source is not required. For example, the electrode 40 shown in FIG. 2 has been supplied with an output signal delivered from an oscillator such as a ring oscillator, a Schmidt trigger circuit or the like disposed on an integrated circuit which is well known in the art.

The output signal may be of a square waveform as shown in FIG. 3a. In the example illustrated, this output signal is shown as forming a source voltage $V_{DD}$ supplied to the integrated circuit. However, it is to be noted that the undermentioned description is equally applicable to other cases.

When a signal such as that shown in FIG. 3a is supplied to the electrode 40, the electric lead 56 is put at a potential having an amplitude $V_P$ expressed by $$V_P = C_{22} V_{DD}/(C_{22} + C_{64}) \tag{2}$$

where $C_{22}$ designates the capacitance of the MOS capacitor 22 and $C_{64}$ designates the parasitic capacitance 64. This amplitude $V_P$ results from the capacitive coupling of the electrode 40 to the electric lead 56 through the MOS capacitor 22. Since $C_{22} >> C_{64}$ generally holds, the expression (2) can approximate the following expression (3):

$$V_P \approx V_{DD} \tag{3}$$

Considering that the source electrode 44 of the MOSFET 28 is generally placed at a ground potential, that MOSFET is brought into its conducting state with the potential on the electric lead 56 equal to about the threshold voltage $V_T(28)$ of the MOSFET 28.

Accordingly, the potential on the electric lead 56 has a magnitude which is variable between $V_T(28)$ and $-(V_P - V_T(28)) \approx -(V_{DD} - V_T(28))$ as shown by the waveform of FIG. 3b. When the steady state is approximately reached, the MOSFET 34 and the diodes 60 and 62 are in their nonconducting state with potentials on the leads 56 and 58 approximating the threshold voltage $V_T(28)$ of the MOSFET 28. On the other hand, the MOSFET 34 and the diodes 60 and 62 are brought into their conducting state with a potential on the electric lead 56 of $-(V_{DD} - V_T(28))$. Under these circumstances, an electric charge from the capacitance 66 is transferred to the electrode 40 through the now conducting MOSFET 34, on the one hand, and the now conducting diodes 60 and 62, on the other hand, and thence through the MOS capacitor 22. This results in the discharge of the capacitance 66. As a result of this discharge, the substrate potential has ultimately a magnitude selectively expressed by $$-(V_{DD} - V_T(28) - V_T(34)) \tag{4}$$

$$-(V_{DD} - V_T(28) - V_F(60)) \tag{5}$$

and $$-(V_{DD} - V_T(28) - V_F(62)) \tag{6}$$

dependent upon relative magnitudes of $V_T(34)$, $V_F(60)$ and $V_F(62)$ where $V_T(34)$ designates the threshold voltage of the MOSFET 34 and $V_F(60)$ and $V_F(62$ respectively) designate forward voltage drops across the diodes 60 and 62.

FIG. 4 shows a mean discharging current plotted in the ordinate which has been plotted against the substrate potential in the abscissa for $V_T(34) > V_F(60) = V_F(62)$. In FIG. 4, the solid curve depicts that current component of the discharging current discharged from the capacitance 66 through the diodes 60 and 62 while dotted curve depicts that current component thereof discharged from the capacitance 66 through the MOSFET 34. The former is greater than the latter.

When $V_T(34) > V_F(60) = V_F(62)$, the substrate potential is discharged to $-(V_{DD} - V_T(28) - V_F(60))$ in the steady state. As a result, the substrate potential has the ultimate magnitude of $-(V_{DD} - V_T(28) - V_F(60))$ as shown by the waveform in FIG. 3c.

On the other hand, when $V_T(34) < V_F(60) = V_F(62)$, the discharging current from the capacitance 66 includes current components through the diodes 60 and 62 which are smaller than that through the MOSFET 34. That is, the two current components are reversed in relative magnitudes from those shown in FIG. 4. Therefore, the substrate potential has the ultimate magnitude expressed by $-(V_{DD} - V_T(28) - V_T(32))$ in the steady state.

From the foregoing it is seen that the substrate bias generator as shown in FIG. 1 performs such an operation that electrons are injected into the P⁻ type semiconductor substrate through the parasitic diodes 60 and 62, on the one hand, and the electrons passed through the MOSFET 34 reach the electrode 54 connected to the second or lower main face of the substrate, on the other hand. Therefore, a shortage of holes is established in the substrate resulting in the substrate potential reaching a negative magnitude. More specifically, the electrons injected into the substrate through the diodes 60 and 62 live within the substrate for a short time interval after which they disappear through their recombination with holes which form majority carriers in P⁻ type semiconductor materials. On the other hand, electrons reaching the second main face of the substrate through the MOSFET 34 instantaneously disappear through their recombination with holes effected on that portion of the electrode 54 contacting the second main face of the substrate. Accordingly, the semiconductor substrate is brought into its storage-of-holes state corresponding to the number of holes recombined with the injected electrons.

In substrate bias generators such as that shown in FIGS. 1 and 2 electrons are injected in the semiconductor substrate through parasitic diodes such as the diodes 60 and 62 as described above. Therefore, such generators have been difficult to be used with dynamic circuits integrated therewith on the same semiconductor chip. In other words, when the electrons injected into the semiconductor substrate are captured by a node located in such a dynamic circuit to store data therein, there might occur a danger in that such electrons would give rise to a malfunction of the circuit due to the influence of the injected electrons on the dynamic circuit. This situation will now be described in conjunction with FIG. 5 wherein there is illustrated, as an example of such dynamic circuits, a dynamic memory cell including a single MOSFET and a single MOS type capacitor.

Figure 5:
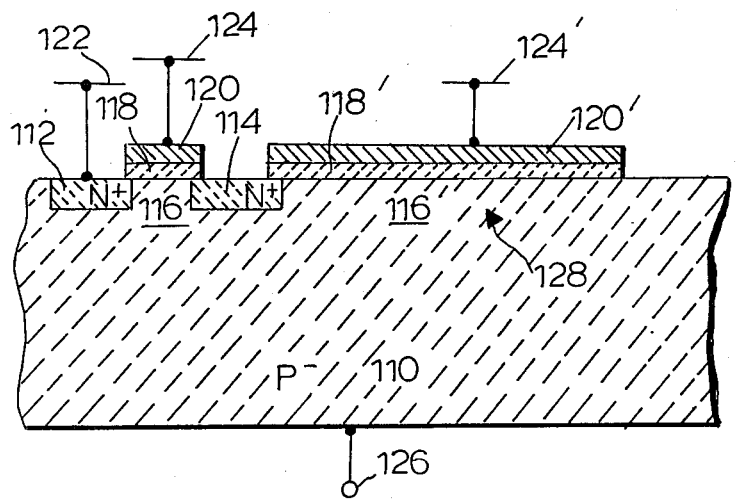
FIG. 5 is a longitudinal sectional view of a dynamic memory cell exemplifying an integrated circuit to which the present invention is applicable.

The illustrated arrangement comprises a P− type semiconductor substrate 110 having a high resistivity and including a pair of opposite main faces, and a pair of N+ type low resistivity semiconductor regions 112 and 114 disposed on one of the main faces, in this case, the upper main face as viewed in FIG. 5 of the substrate 110 to form a predetermined spacing therebetween. The N+ type semiconductor regions 112 and 114 act as a drain region and a source region of an MOSFET generally designated by the reference numeral 116 and having a gate oxide film 118 underlaid with that portion of the upper main face of the substrate 110 defined by the semiconductor regions 112 and 114 and the adjacent portions of the latter, and a gate electrode 120 disposed on the gate oxide film 118. The drain region 112 is connected to an electric lead 122 which is called a "bit line" and the gate electrode 120 is connected to an electric lead 124 called a "word line".

Another gate oxide film 118' overlaid with another gate electrode 120' is disposed on the upper main face of the substrate 110 so that one end thereof is located on the end portion of the semiconductor region 114 remote from the gate oxide film 118 and the other end thereof is spaced from the region 114 by a predetermined distance. The gate oxide film 118' and gate electrode 120' form parts of an MOS type capacitor generally designated by the reference numeral 116' as will be described later. The gate electrode 120' is connected to an electric lead 124' having normally applied thereto a maximum voltage, for example of +5 volts used with the arrangement of FIG. 5.

When a voltage of +5 volts is applied to the electrode 120', electrons are induced on that portion of the upper main face of the P− type semiconductor substrate 110 adjacent to the source region 114 of the MOSFET 116. Therefore, an MOS type capacitor 116' is formed between the source region 114 and the gate electrode 120'.

An electrode 126 is connected to the other or lower main face of the substrate 110.

Accordingly, the arrangement of FIG. 5 has an equivalent circuit as shown in FIG. 6 wherein like reference numerals designate the components identical to those illustrated in FIG. 5.

In order to write data with a high potential corresponding to a binary ONE into the dynamic memory cell as shown in FIGS. 5 and 6, the bit line 122 is placed at a high potential. The word line 124 is then placed at a high potential to bring the MOSFET 116 into its conducting state. This conduction of the MOSFET 116 causes the potential on the bit line 122 to be transferred to the source region 114 of the MOSFET 116. Therefore, the MOS type capacitor 116' is charged to the high potential. At that time the number of electrons becomes very small within the MOS capacitor 116'.

The word line 124 is then returned back to a low potential, whereupon the MOSFET 116 is placed in its nonconducting state. Accordingly, the bit line 122 is electrically isolated from the source region 114 with the result that the MOS type capacitor 116' charged to the high potential is left intact. At that time, the memory cell stores and holds written data corresponding to a binary ONE.

Under these circumstances, it is assumed that the substrate bias generator shown in FIGS. 1 and 2 is operated to inject electrons into the substrate 10 through the diodes 60 and 62. Under the assumed conditions, some of the electrons thus injected may reach the vicinity of the MOS type capacitor 116' as shown at the arrow 128 in FIG. 5. As those electrons form minority carriers within the P− type semiconductor substrate 110, the electrons are normally recombined with holes and disappear while the electrons are not so spaced from a source into which they have been injected. According to circumstances, however, some of the injected electrons reach the vicinity of the memory cell. Assuming that such electrons are captured by the MOS type capacitor 116' charged to the high potential so as to thereby have a very small number of electrons, a charged voltage across the MOS type capacitor 116' changes from its high to its low magnitude which may be equal to a ground potential as the case may be. This results in a malfunction that, as the ground potential corresponds to data expressed by a binary ZERO, the written data is read out as a binary ZERO from the memory cell, although a binary ONE should be written therein. This means that conventional substrate bias generators such as that shown in FIGS. 1 and 2 have had disadvantages in that an associated dynamic circuit such as a dynamic memory cell may malfunction.

Figure 7:
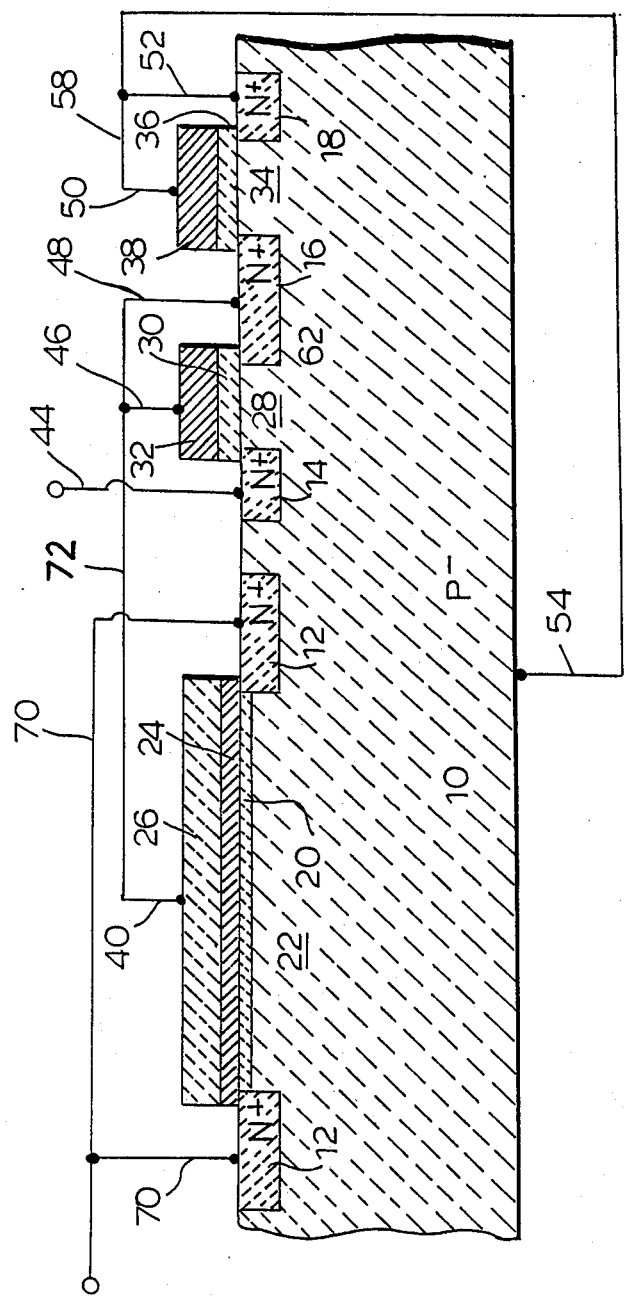
FIG. 7 is a longitudinal sectional view of one embodiment of a substrate bias generator for producing a potential in a semiconductor substrate according to the present invention.

Referring now to FIG. 7, wherein like reference numerals designate the components identical to those shown in FIG. 1, there is illustrated one embodiment according to the substrate bias generator of the present invention. The arrangement illustrated is different from that shown in FIG. 1 only in the connection of the electrodes. More specifically, FIG. 7 shows an electrical lead 70 connecting the two semiconductor regions 12 to each other and acting as one of the electrodes of the MOS capacitor 22 while another electrical lead 72 connecting the gate electrode 46 and the drain electrode 48 of the first MOSFET 28 or the source electrode 48 of the second MOSFET 34 to other electrode 40 of the MOS capacitor 22 but not to the electrodes of the semiconductor regions 12.

The N type semiconductor region 20 may be disposed on the first or upper main face of the substrate 10 by ion implantation but it should have such an impurity concentration that the threshold voltage $V_T(22)$ of the MOS capacitor 22 is negative. The semiconductor region 20 may also be disposed on the semiconductor substrate 10 simultaneously with the semiconductor regions 12.

Figure 8:
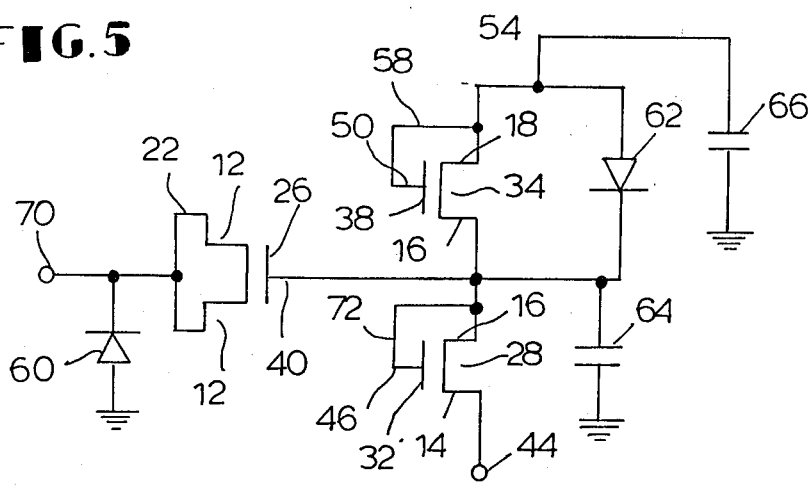
FIG. 8 is a circuit diagram equivalent to the arrangement shown in FIG. 7.

The arrangement of FIG. 7 has an equivalent circuit shown in FIG. 8 wherein like reference numerals designate the components identical to those shown in FIGS. 7 and 2. In FIG. 8, the electrical lead 70 is connected to ground through the parasitic diode 60 developed between the semiconductor regions 12 and the substrate 10 with an anode electrode thereof grounded, whereas in FIG. 2, the parasitic diode 60 is connected across the parasitic diode 62.

The operation of the arrangement shown in FIG. 7 will now be described. It is recalled that, in the arrangement shown in FIG. 1, an oscillator such as a ring oscillator or a Schmidt trigger circuit supplies a signal to the semiconductor regions 12 forming the gate electrode 40 of the MOS capacitor 22. In the arrangement shown in FIG. 7, however, the signal from the oscillator is applied to the electric lead or electrode 70 and thence to the semiconductor regions 12 of the MOS capacitor 22 which distinctively distinguishes the arrangement shown in FIG. 7 from that shown in FIG. 1. Under these circumstances, a current discharged from the substrate 10 through the parasitic diodes 60 and 62 in the arrangement shown in FIG. 2 whereas, a current is discharged only through the parasitic diode 62 in the arrangement shown in FIG. 8.

Accordingly, the number of electrons injected into the substrate 10 is sharply decreased. This will now be described in more detail with reference to FIG. 9.

Figure 9A:
FIGS. 9a, 9b and 9c are graphs illustrating waveforms developed at various points in the arrangement shown in FIG. 7.

The oscillator supplies a signal to the electrode 70 in the form of a train of square pulses as shown by the waveform in FIG. 9a and having an amplitude of $V_{DD}$. Since the signal applied to the electrode is only of a positive voltage, the diode 60 is always reversely biased with the result that electrons are prevented from being injected into the substrate 10 through the diode 60. The MOS capacitor 22 is responsive to the applied signal or pulse train to produce a signal at the gate electrode 46 as shown by the waveform in FIG. 9b. This waveform immediately appears at the gate and drain electrodes 46 and 48 of the first MOSFET 28. The substrate 10 has an ultimate potential of $-(V_{DD}-V_T(28)-V_F(62))$ developed thereon as shown by the waveform in FIG. 9c, assuming that $V_T(34) > V_F(62)$.

Figure 9B:
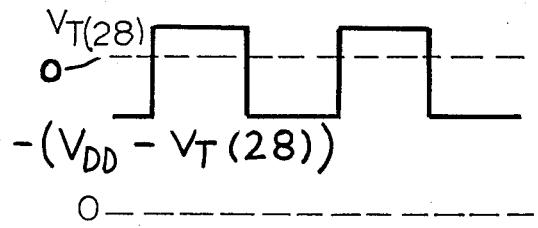
Figure 9C:
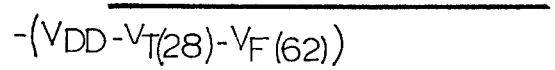

From the waveform shown in FIG. 9b it is seen that the signal developed on the gate electrode 40 of the MOS capacitor 22 has a potential level which is variable in accordance with the signal from the oscillator applied to the electrode 70. This is because the threshold voltage of the MOS capacitor 22 has been set to be negative.

On the other hand, electrons are injected through the MOS capacitor 22 from the second or lower main face of the substrate 10. Those injected electrons are immediately recombined with holes in the vicinity of the second main face of the substrate 10 and disappear. As a result, a hole current flows through the interior of the substrate 10.

This means that electrons injected into the substrate 10 through the PN junction are recombined with holes which are majority carriers within the substrate and extinguished, resulting in a small probability of adversely affecting the storing and holding characteristics of the dynamic circuit shown in FIG. 5.

The foregoing is equally applicable to the threshold voltage $V_T(34)$ less than the forward voltage drop $V_F(62)$ of the parasitic diode 62. In this case, however, the substrate 10 has an ultimate potential expressed by $-(V_{DD}-V_T(28)-V_T(34))$.

From the foregoing it is seen that, according to the present invention, a substrate bias generator circuit integrated on the same semiconductor chip as an associated dynamic circuit includes a coupling capacitor which is of an MOS type and has one electrode formed of an N+ type semiconductor region and is supplied with a signal from an oscillator. This measure causes the parasitic diode developed between the N+ type semiconductor region and the semiconductor substrate to be always reverse biased with the result that no electron from that region is injected into the substrate in contrast of the prior art practice. Therefore, the present invention is advantageous in that there is a decrease in the number of electrons injected into the substrate as a whole from the substrate bias generator circuit and accordingly, there is a minimum probability of malfunction of the dynamic circuit.

While the present invention has been illustrated and described in conjunction with a single preferred embodiment thereof, it is to be understood that numerous changes and modifications may be resorted to without departing from the spirit and scope of the present invention. For example, the present invention is equally applicable to the polarity reversed from that illustrated with the voltage changed in polarity accordingly.

What we claim is:

1. A substrate bias generator for generating a potential in a semiconductor substrate, comprising: a semiconductor substrate of a first conductivity type and including a pair of first and second main faces which are opposite to each other; a first, a second and a third semiconductor region of a second conductivity type disposed at predetermined intervals on said first main face of said semiconductor substrate; a first MOSFET disposed on said first main face of said semiconductor substrate and including a source region formed of said first semiconductor region, a drain region formed of said second semiconductor region and a gate electrode; a second MOSFET disposed on said first main face of said semiconductor substrate and including a source region formed of said second semiconductor region, a drain region formed of said third semiconductor region, and a gate electrode; an MOS capacitor disposed on said first main face of said semiconductor substrate and including a first electrode formed of a semiconductor region of said second conductivity type and disposed on said first main face of said semiconductor substrate, and including a second electrode disposed on the last mentioned semiconductor region through an electrically insulating film; another electrode laid on said second main face of said semiconductor substrate, said first electrode of said MOS capacitor being supplied with positive pulses; a first electric lead for connecting said second electrode of said MOS capacitor to said gate electrode and drain region of said first MOSFET; a second electric lead for connecting said source region of said first MOSFET to ground; and a third electric lead for electrically connecting said gate electrode and drain region of said second MOSFET to said electrode on said second main face of said semiconductor substrate.

* * * * *